United States Patent
Wu (10) Patent No.: US 6,955,987 B2
(45) Date of Patent: Oct. 18, 2005

(54) COMPARISON OF CHEMICAL-MECHANICAL POLISHING PROCESSES

(75) Inventor: Kuo-Chun Wu, San Jose, CA (US)

(73) Assignee: Mosel Vitelic, Inc., Hsin Chu (CN)

(*) Notice: Subject to any disclaimer, the term of this patent is extended or adjusted under 35 U.S.C. 154(b) by 180 days.

(21) Appl. No.: 10/309,473

(22) Filed: Dec. 3, 2002

(65) Prior Publication Data

US 2004/0106283 A1 Jun. 3, 2004

(51) Int. Cl.$^7$ .............................................. H01L 21/302
(52) U.S. Cl. .............................. 438/692; 438/5; 438/8; 438/14; 438/926; 216/84; 216/88; 451/5; 451/41; 451/57
(58) Field of Search ................................ 438/690–693, 438/747, 753, 926, 5–18; 216/84, 86, 88–91; 451/5, 41, 57

(56) References Cited

U.S. PATENT DOCUMENTS

| | | | |
|---|---|---|---|
| 5,723,874 A | * 3/1998 | Baker et al. ................... | 257/48 |
| 6,087,733 A | * 7/2000 | Maxim et al. ............... | 257/797 |
| 6,093,631 A | * 7/2000 | Jaso et al. .................... | 438/618 |
| 6,500,712 B1 | 12/2002 | Wu | |
| 6,531,387 B1 | 3/2003 | Wu | |
| 6,682,398 B2 | * 1/2004 | Meyer ........................... | 451/5 |

OTHER PUBLICATIONS

Wolf, Silicon Processing for the VLSI Era, 2002, Lattice Press, vol. 4, pp. 421–422.*
Wolf, Silicon Processing for the VLSI Era, 1986, Lattice Press, vol. 1, pp. 521–522, 540.*
Boning et al., "Pattern Dependent Modeling for CMP Optimization and Control", *Proc. Symp. P: Chemical Mechanical Polishing*, MRS Spring Meeting, Apr. 1999, pp. 1–13.
Chang et al., "Full Profile Inter–Layer Dielectric CMP Analysis", Int'l Symp. Semicon. Mfg., Oct. 8–10, 2001, 4 pp.
Hetherington et al., "Improved Polysilicon Surface–micromachined Micromirror Devices using Chemical–mechanical Polishing", Int'l Symp. Optical Science, Engineering, and Instrumentation, Jul. 19–24, 1998, 6 pp.
Li et al., "Chemical Mechanical Polishing in Silicon Processing", *Semiconductors and Semimetals* (Academic Press), vol. 63, 2000, pp. 1–42, 8–100, and 113–131.
Woodie, "Chemical Mechanical Polishing Primer", Cornell Univ., http://www.cnf.cornell.edu/equipment/CMPPrimer.html, Oct. 9, 2001, pp. 1–18.
Wrschka, "Chemical Mechanical Planarization of Copper Damascene Structures", *J. Electrochemical Soc.*, vol. 47, No. 2, 2000, pp. 706–712.

* cited by examiner

*Primary Examiner*—Nadine G. Norton
*Assistant Examiner*—Eric B. Chen
(74) *Attorney, Agent, or Firm*—Ronald J. Meetin

(57) ABSTRACT

Chemical-mechanical polishing ("CMP") processes performed on bodies (10), each having areas (16 and 18) of different depression pattern densities, are compared by correlating polishing data accumulated, for one such body, on an area (16) of one pattern density to polishing data accumulated, for that body, on an area of another pattern density for each of the CMP processes.

28 Claims, 5 Drawing Sheets

COMPARISON OF CHEMICAL-MECHANICAL POLISHING PROCESSES

FIELD OF USE

This relates to chemical-mechanical polishing ("CMP"), sometimes referred to as chemical-mechanical planarization (also "CMP"). This relates particularly to CMP employed in semiconductor fabrication processes.

BACKGROUND ART

CMP is utilized for removing part of a layer of a body, typically a semiconductor wafer, to provide the body with a generally flat surface in which the remainder of the layer occupies one or more depressions that extend along the body's surface in a desired pattern. During CMP, material of the depression-occupying layer is abraded with a mechanical apparatus starting at protruding areas while suitable chemicals are applied to the layer in order to weaken it and carry away abraded particles. CMP for silicon semiconductor devices is generally described in Li et al, "Chemical Mechanical Polishing in Silicon Processing", *Semiconductors and Semimetals* (Academic Press), Vol. 63, 2000.

Erosion and overpolishing are important planarity concerns in CMP. Erosion leads to the formation of depressed regions along a surface being polished. As a result, the final polished surface is commonly not as planar as desired. Erosion generally increases with increasing depression pattern density. This arises largely because CMP processes remove material of the depression-occupying layer at a considerably faster rate than the field material situated to the sides of the depression or depressions. The depression pattern density at a portion of a surface being polished is generally the ratio of the total depressed area, if any, in the surface portion to the sum of the depressed area and the intervening non-depressed area.

Overpolishing refers to performing CMP for a somewhat longer time than necessary to remove the material of the depression-occupying layer situated over the field area to the sides of the depressed area. Overpolishing is performed in order to ensure that all the material of the depression-occupying layer situated over the field area is indeed removed. As a result, the exposed surface of the remaining depression-occupying material lies below the surface of the field area. Also, the surface of the depression-occupying material at areas of high pattern density is typically more recessed than the surface of depression-occupying material at areas of low pattern density, leading to further non-planarity.

CMP processes typically reduce height differences along the final polished surfaces. However, it is often difficult to compare CMP processes to determine which process actually provides better planarity. Different CMP processes commonly terminate at different end points, especially due to overpolishing. Consequently, absolute polishing data for one CMP process often cannot be readily compared to absolute polishing data for another CMP processes. In light of this, it is desirable to have an accurate technique for comparing CMP processes.

GENERAL DISCLOSURE OF THE INVENTION

The present invention furnishes a technique for comparing CMP processes performed on bodies such as semiconductor wafers. Starting with a group of such bodies that each have areas of different depression pattern densities, the present comparison technique basically entails correlating polishing data accumulated, for one such body, on an area of one pattern density to polishing data accumulated, for that body, on an area of another pattern density for each of two different CMP processes, and then comparing the correlated different-pattern-density data for one of the CMP processes to the correlated different-pattern-density data for the other CMP process. Because polishing data obtained on one area of each body is first correlated to polishing data obtained on another area of that body, comparison difficulties that would normally arise from CMP end-point differences are avoided. This enables the comparative technique of the invention to be highly accurate.

More particularly, a CMP comparison technique in accordance with the invention is performed with one or more first bodies and one or more second bodies. Each first body has an internal surface provided with (a) a pattern of one or more depressions at a first depression pattern density in one lateral area and (b) a pattern of one or more depressions at a second depression pattern density in another lateral area. The two pattern densities are different. Each second body has an internal surface similarly provided with (a) a pattern of one or more depressions largely at the first pattern density in one lateral area and (b) a pattern of one or more depressions largely at the second pattern density in another lateral area. Each body includes a depression-occupying layer that covers its internal surface and extends into its one or more depressions.

Values of CMP erosion that respectively occur along the areas of the first and second pattern densities of each first body generally at its one or more depressions are determined at each of one or more processing points as a result of chemically-mechanically polishing each first body along its depression-occupying layer according to a first CMP process. A polishing point is a point or stage, e.g., a period of time during which CMP is halted, at which erosion is determined at areas of different pattern density subjected to substantially the same amount of CMP. Values of erosion that respectively occur along areas of the first and second pattern densities of each second body generally at its one or more depressions are similarly determined at each of one or more processing points as a result of chemically-mechanically polishing each second body along its depression-occupying layer according to a second CMP process different from the first CMP process.

Correlation information for the first CMP process is generated by correlating the erosion value at the area of second pattern density at each processing point for each body to the erosion value at the area of first pattern density at that processing point for that first body. A similar correlation procedure is employed with the erosion values for each second body to generate correlation information for the second CMP process. The correlation information for the second CMP process is then compared to the correlation information for the first CMP process. This typically includes determining which, if either, of the correlation informations meets, or comes closest to meeting, specified target correlation criteria. In cases where the correlation information for only one of the CMP processes meets, or comes closest to meeting, the target criteria, that particular CMP process is typically designated as the better of the two CMP processes.

The correlation procedure may, for example, entail graphically plotting the erosion value for the area of second pattern density at each processing point for each body as a function of the erosion value for the area of first pattern density at that processing point for that body. When there are multiple such graphical data points for each of the CMP processes, the data points for each CMP process can be graphically approximated by a straight line on a linear-linear graphical scale.

It is generally desirable for erosion that occurs in a particular CMP process to be the same at areas of different depression pattern density. The erosion values for areas of one depression pattern density when graphically plotted as a function of the respectively corresponding erosion values at an area of another pattern density should, on a linear-linear graphical scale, thus ideally follow a straight line having a slope of 1. In situations where the erosion-erosion data points for the two CMP processes under comparison are approximated by respective straight lines, the comparison operation typically includes designating the CMP process whose straight line has a slope closest to 1 as the better CMP process.

BRIEF DESCRIPTION OF THE DRAWINGS

FIGS. 2d.1–2f.1 are cross-sectional side views representing stages for completing CMP on one of the two bodies represented by FIG. 2c according to the CMP process in one of the two fabrication sequences.

FIGS. 2d.2–2f.2 are cross-sectional side views representing stages for completing CMP on the other of the bodies represented by FIG. 2c according to the CMP process in the other of the fabrication sequences.

FIGS. 3.1 and 3.2 are plan views of the respective bodies of FIGS. 2f.1 and 2f.2 after completion of CMP respectively according to the two CMP processes. The cross section of FIG. 2f.1 is taken along plane 2f.1—2f.1 in FIG. 3.1. The cross section of FIG. 2f.2 is taken along plane 2f.2—2f.2 in FIG. 3.2.

FIGS. 5–8 are cross-sectional side views of four implementations of part of each body represented by FIG. 2a.

Like reference symbols are employed in the drawings and in the description of the preferred embodiments to represent the same, or very similar, item or items.

DESCRIPTION OF THE PREFERRED EMBODIMENTS

Figure 1:
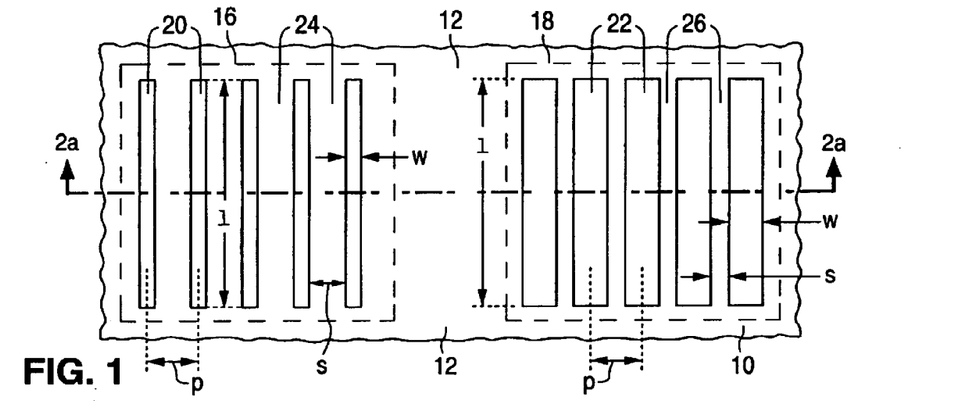
FIG. 1 is a plan view representing part of each of two largely identical bodies, typically semiconductor wafers, each having lateral areas patterned with trench-shaped depressions at two different pattern densities.

FIGS. 1, 2a–2c, 2d.1–2f.1, 2d.2–2f.2, 3.1, 3.2, 4a, and 4b facilitate understanding of how two different CMP processes are compared in accordance with the invention. The CMP processes are respectively employed in two fabrication sequences represented collectively by FIGS. 2a–2c, 2d.1–2f.1, and 2d.2–2f.2. Each fabrication sequence consists of an initial portion and a CMP portion. The initial portions of the two fabrication sequences are largely identical and are respectively performed on two substantially identical bodies 10, typically semiconductor wafers. The initial portions of the two fabrication sequences are commonly represented by FIGS. 2a and 2b. FIG. 1 depicts a plan view of part of each body 10 at the initial stage of FIG. 2a.

Figure 2A:
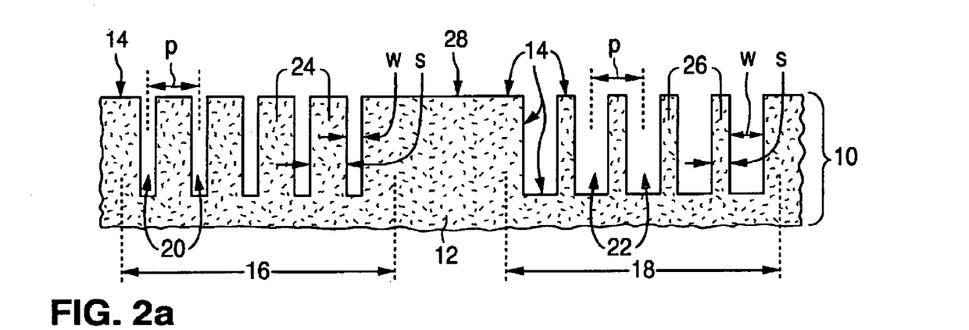
FIGS. 2a–2c are cross-sectional side views representing initial stages in two fabrication sequences that respectively employ two different CMP processes for polishing depression-occupying layers respectively provided over the two bodies, again typically semiconductor wafers, represented by the plan view of FIG. 1. The cross-section of FIG. 2a is taken along plane 2a—2a in FIG. 1.

As shown in FIGS. 1 and 2a, each body 10 initially consists of a substructure 12 having an upper surface 14. Substructure 12 may be variously formed with electrically conductive material, semiconductor material, and electrically insulating material. Examples of the constituency of substructure 12 are presented below in connection with FIGS. 5–8.

Each body 10 has a first lateral area 16 and a second lateral area 18. Lateral area 16 contains a first pattern of largely straight trench-like depressions 20 extending largely parallel to one another at a first below-unity depression pattern density. Lateral area 20 contains a second pattern of largely straight trench-like depressions 22 extending largely parallel to one another at a second below-unity depression pattern density different from the first depression pattern density. Depressions 20 and 22 extend into substructure 12 of each body 10 along its upper substructure surface 14.

In each body 10, a wall-shaped field portion 24 of substructure 12 separates each consecutive pair of trenches 20. A wall-shaped field portion 26 of substructure 12 similarly separates each consecutive pair of trenches 22. Upper substructure surface 14 has a generally flat portion 28 that laterally surrounds each depression pattern. That is, flat surface portion 28 laterally surrounds trenches 20 and intervening walls 24 in area 16. Surface portion 28 laterally surrounds depressions 22 and intervening walls 26 in lateral area 18.

Each lateral area 16 or 18 typically has the same number n of trenches 20 or 22. In the present example, n is 5. However, n can be greater than, or less than, 5. Also, the number of trenches 22 in area 18 can differ from the number of trenches 20 in area 16.

The sidewalls of trenches 20 and 22 are typically approximately vertical as indicated in FIG. 2a. In other words, the trench sidewalls typically extend approximately perpendicular to flat surface portion 28. Nonetheless, the trench sidewalls can slope inward or outward. FIG. 1 illustrates an example in which trenches 22 of each body 10 extend largely parallel to trenches 20 of that body 10. Alternatively, trenches 22 of each body 10 can extend at a non-zero angle, e.g., 90° or 45°, to trenches 20 of that body 10.

In each body 10, trenches 22 as a group are, for convenience in illustration, shown as being relatively close to trenches 20 as a group with only a depression-free portion of substructure 12 laterally separating trenches 22 as a group from trenches 20 as a group. However, trenches 22 as a group may be widely separated from trenches 20 as a group on each body 10. Also, one or more other depressions of various shapes and sizes may lie between trenches 22 as a group, on one hand, and trenches 20 as a group, on the other hand.

Trenches 20 are illustrated here as being largely identical to one another and at largely equal trench-to-trench spacings. While it is convenient to lay out trenches 20 in this manner, trenches 20 can variously differ in shape and in trench-to-trench spacings. The same applies to trenches 22 which are illustrated here as being largely identical to one another and at largely equal trench-to-trench spacings. Subject to trenches 22 being at a different depression pattern density than trenches 20, important considerations with respect to the patterning and depth of trenches 20 and 22 are that (a) trenches 20 be of largely the same pattern and depth in lateral areas 16 of both of bodies 10 and (b) trenches 22 be of largely the same pattern and depth in lateral areas 18 of both bodies 10.

The depression pattern density in a lateral area such as area 16 or 18 is the ratio of the amount of lateral area occupied by the depressions, such as depressions 20 or 22, to the sum of (a) the amount of lateral area occupied by the depressions and (b) the amount of field lateral area between the depressions. Each trench 20 or 22 is of a lateral width w and a lateral length l. Each trench-separating wall 24 or 26 is of a lateral width s and a lateral length l, where width s is the trench-to-trench spacing of trenches 20 or 22. Accordingly, the depression pattern density in area 16 or 18 is nlw/[nlw+(n−1)ls] which simplifies to nw/[nw+(n−1)s]. Since bench-to-trench spacing s is positive value for each of areas 16 and 18, the depression pattern density for each area 16 or 18 here is below unity (less than 1). For large n, the depression pattern density is approximately w/(w+s). In the present example, the depression pattern density of trenches 22 in area 18 is greater than the depression pattern density of trenches 20 in area 16.

The pitch p of trenches 20 or 22 is the distance w/2+s+w/2 from the longitudinal centerline of one of trenches 20 or 22 to the longitudinal centerline of the next trench 20 or 22. Hence, pitch p is w+s. Trenches 20 or 22 are preferably at largely the same value of pitch p. Since trenches 22 are at greater depression pattern density than trenches 20, trenches 22 are at a greater value of trench width w than trenches 20. Likewise, trenches 22 are at a lesser value of trench-to-trench spacing s than trenches 20.

Pitch p is typically 0.2–20 µm. Trench width w is typically 0.1–10 µm. Width w for trenches 22 is typically 1.5–4 times width w for trenches 20. Similarly, the depression pattern density of trenches 22 in area 18 is typically 1.5–4 times the depression pattern density of trenches 20 in area 16. Length l of trenches 20 and 22 is typically 10–500 µm. The depth of trenches 20 and 22 is typically 100–1000 nm.

Figure 2B:
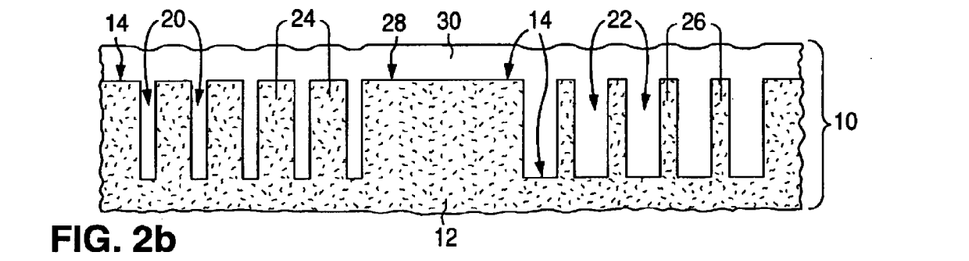

A depression-occupying layer 30 is provided on top of substructure 12 of each body 10 as shown in 2b. Depression-occupying layer 30 of each body 10 completely fills that body's trenches 20 and 22. Upper substructure surface 14 of each body 10 is fully covered by that body's depression-occupying layer 30 and is now an internal surface of that body 10.

Each depression-occupying layer 30 may variously consist of electrically conductive, semiconductive, and electrically insulating material subject to the requirement that the material of layer 30 be removable (erodable) at a much faster rate than the material of substructure 12 along internal surface 14 during CMP. Examples of the constituency of layer 30 are presented below in connection with FIGS. 5–8. Layer 30 can be formed by techniques such as evaporation, sputtering, chemical vapor deposition, and spin-on deposition, including various reflow steps depending on the constituency of layer 30 and the characteristics of substructure 12.

Letting the two bodies 10 be referred to as first body 10 and second body 10, CMP is performed along depression-occupying layer 30 of first body 10 according to a first CMP process in order to remove material of that layer 30 situated outside underlying depressions 20 and 22 and thereby provide first body 10 with a generally planar upper surface. CMP is performed along layer 30 of second body 10 according to a second CMP process different from the first CMP process in order to remove material of that layer 30 situated outside underlying trenches 20 and 22 and similarly thereby provide second body 10 with a generally planar upper surface. Each CMP process removes material of layer 30 at a considerably greater rate than the underlying material of substructure 12 along internal surface 14.

Figure 2C:
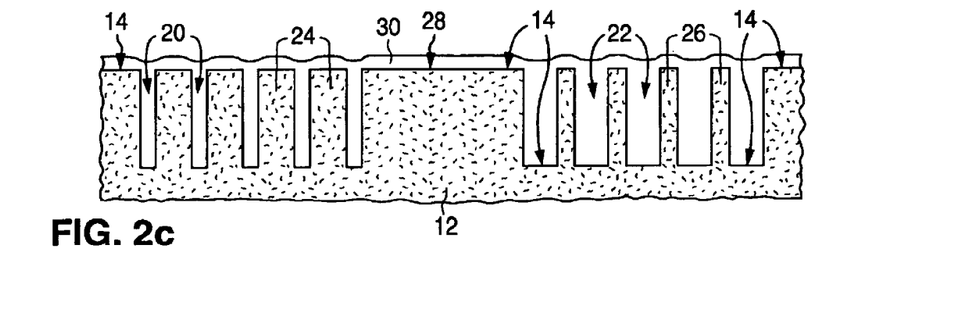
Figure 2D:
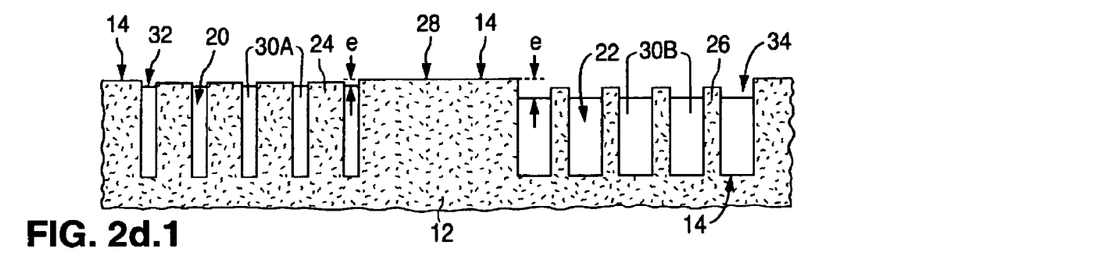
Figure 2D:
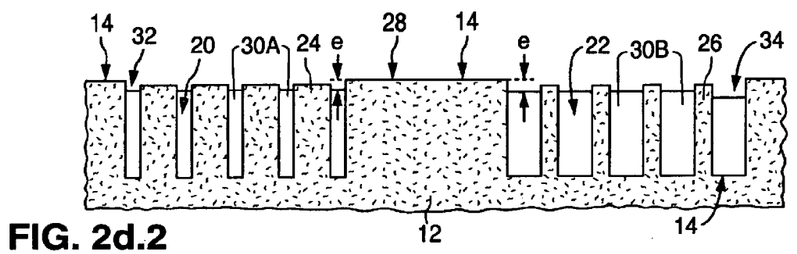
Figure 2E:
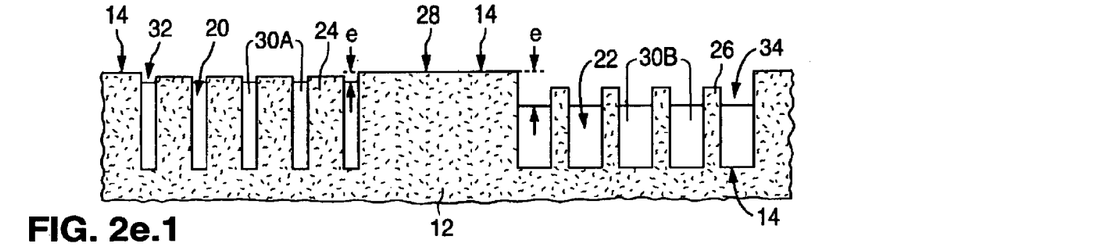
Figure 2E:
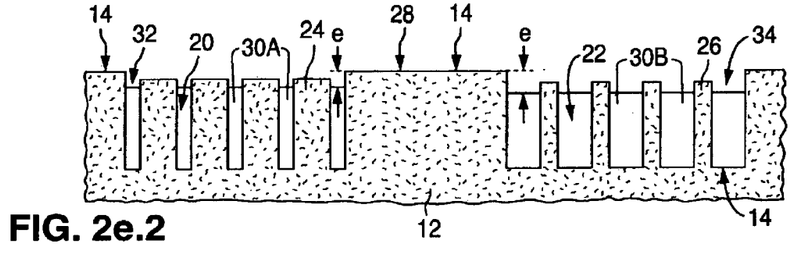
Figure 2F:
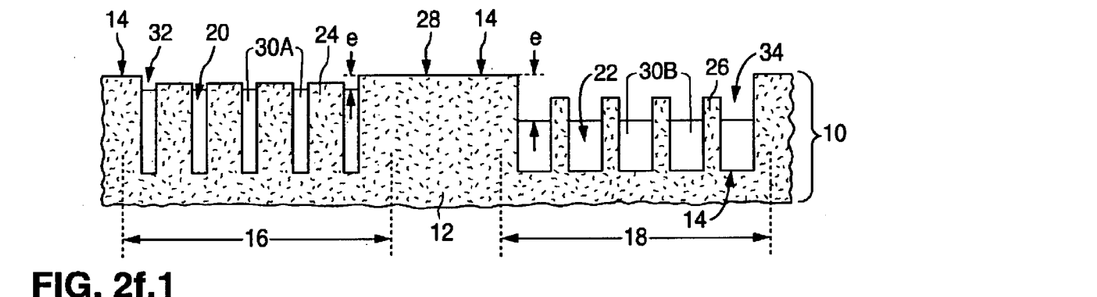
Figure 2F:
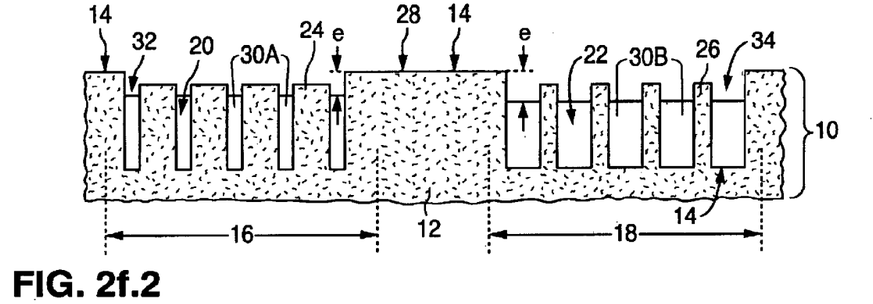

FIG. 2c depicts roughly how bodies 10 appear at similar points in both CMP processes after parts of depression-occupying layers 30 have been removed but before any parts of internal surfaces 14 are exposed. Because the two CMP processes are different, the amount of polishing time taken by the second CMP process to reach the intermediate structure of FIG. 2c is typically different from the amount of polishing time taken by the first CMP process to reach that intermediate structure.

Eventually, sufficient material of depression-occupying layers 30 is removed by CMP to expose flat portions 28 of internal surfaces 14 in both bodies 10. To ensure that material of layers 30 outside trenches 20 and 22 is fully removed in both bodies 10, CMP according to the two CMP processes is conducted somewhat beyond the points at which surfaces 28 are fully exposed. That is, bodies 10 are overpolished somewhat. As the overpolishing is performed, the different polishing characteristics of the two CMP processes may cause the structural (or dimensional) characteristics of bodies 10 to differ significantly.

FIGS. 2d.1–2f.1 present an example of how the structural characteristics of first body 10 changes as it undergoes overpolishing during CMP according to the first CMP process. FIGS. 2d.2–2f.2 present an example of how the structural characteristics of second body 10 change as it is similarly overpolished according to second CMP process. FIGS. 3.1 and 3.2 respectively illustrate plan views of the two bodies 10 at the respective final stages of FIGS. 2f.1 and 2f.2. Items 30A in FIGS. 2d.1–2f.1, 2d.2–2f.2, 3.1, and 3.2 are the remaining plug-shaped portions of depression-occupying layers 30 situated in trenches 20. Items 30B similarly are the remaining plug-shaped portions of layers 30 situated in trenches 22.

CMP is normally of a nature that, for a given CMP process, erosion of material during overpolishing increases as the depression pattern density increases. As indicated by the structural changes shown in FIGS. 2d.1–2f.1, the first CMP process is an example of a CMP process in which erosion during overpolishing increases greatly with increasing depression pattern density. In contrast, as indicated by the structural changes shown in FIG. 2d.2–2f.2, the second CMP process is an example of a CMP process in which overpolishing erosion increases considerably less with increasing depression pattern density than in the first CMP process.

Values of erosion e during CMP overpolishing are measured downward from flat portion 28 of surface 14 in each body 10. The material that defines each surface 28 may be eroded slightly during overpolishing. Because the relative erosion difference between areas of different pattern density is of primary interest, any such erosion-caused change in the reference point for measuring erosion e is generally not a problem.

During CMP overpolishing, depression-separating walls 24 and 26 erode significantly although not as much as plug-shaped portions 30A and 30B. In particular, walls 24 and 26 become progressively shorter during overpolishing. As a result, a valley 32 is formed along the upper body surface at the locations of trenches 20 and walls 24 in each body 10. A valley 34 is similarly formed along the upper body surface at the location of trenches 22 and walls 26 in each body 10. Walls 24 and 26 protrude upward at the bottoms of valleys 32 and 34. Erosion that occurs along the exposed side portions of walls 24 and 26 is, for simplicity, not indicated in the drawings.

Valley 34 at the second, or high, depression pattern density in each body 10 normally starts forming before valley 32 at the first, or low, depression pattern density in that body 10. This occurs because of the CMP overpolishing erosion dependence on depression pattern density. This difference in the points at which valleys 32 and 34 start to form is not illustrated in FIGS. 2c, 2d.1–2f.1, and 2d.2–2f.2 but is dealt with below in connection with FIGS. 4a and 4b.

Erosion e can be measured down to the tops of plugs 30A and 30B in trenches 20 and 22. Erosion can also be measured down to a composite (average top surface) of plugs 30A and walls 24 at the bottom of valley 32, and down to a corresponding composite of plugs 30B and walls 26 at the bottom of valley 34. Either way of measuring erosion is suitable for generating erosion data at areas of different depression pattern density for use in comparing the two CMP processes according to the invention.

Typical equipment for measuring erosion does not distinguish between the various materials located along the bottoms of valleys 32 and 34. Accordingly, the values of erosion e determined at the locations of trenches 20 are typically values averaged across walls 24 and plugs 30A situated in trenches 20 at the bottom of valley 32. The values of erosion determined at the locations of trenches 22 are likewise typically values averaged across walls 26 and plugs 30B situated in trenches 22 at the bottom of valley 34. If the erosion-measuring equipment can measure erosion precisely at the tops of plugs 30A and 30B, each value of erosion at trenches 20 or 22 can be a value averaged across multiple ones of trenches 20 or 22.

First and second values of erosion e that respectively occur in valleys 32 and 34 along lateral areas 16 and 18, and thus respectively occur largely at trenches 20 and 22, are determined at each of one or more processing points for each of bodies 10 during the overpolishing phases of CMP according to the first and second CMP processes. That is, two erosion values, one for area 16 at the first depression pattern density and the other for area 18 at the second depression pattern density, are measured for first body 10 at each such processing point for first body 10 during its overpolishing phase. Two erosion values, one for area 16 at the first depression pattern density and the other for area 18 at the second depression pattern density are likewise measured for second body 10 at each such processing point for second body 10 during the second body's overpolishing phase. These erosion values are normally determined at each of two or more processing points for each body 10.

A processing point is a point or stage at which values of erosion e are measured at valleys 32 and 34 along areas 16 and 18 of each body 10 when areas 16 and 18 of that body 10 have been subjected to substantially the same amount of polishing according to the first and second CMP processes. A processing point is typically a period of time during which CMP is halted on each body 10 to allow erosion measurements to be made in valleys 32 and 34 of that body's areas 16 and 18. If further overpolishing is needed, the halt is temporary, and CMP is re-started after the halt.

If the erosion-measurement equipment can make erosion measurements while bodies 10 are actively being polished, a processing point can largely be an instant of time at which erosion measurements are simultaneously made at valleys 32 and 34. FIGS. 2d.1–2f.1 represent three erosion-determination processing points for first body 10 regardless of whether CMP is halted or active during erosion measurement. FIGS. 2d.2–2f.2 similarly represent three erosion-determination processing points for second body 10.

Correlation information for the first CMP process is generated by correlating the erosion value determined for area 18 at the second depression pattern density at each processing point for first body 10 to the erosion value determined for area 16 at the first depression pattern density at that processing point for first body 10. Correlation information for the second CMP process is similarly generated by correlating the erosion value determined for area 18 at the second depression pattern density at each processing point for second body 10 to the erosion value determined for area 16 at the first depression pattern density at that processing point for second body 10.

The correlation information for the second CMP process is subsequently compared to the correlation information for the first CMP process. This typically involves determining which, if either, of the two sets of correlation information meets, or most closely meets, specified correlation target criteria. If the correlation information for only one of the CMP processes meets, or most closely meets, the target criteria, that CMP process is typically designated as the better of the two CMP processes.

The correlation procedure typically involves preparing a graph, normally a linear-linear graph, in which the erosion value for area 18 or 16 at each processing point for each body 10 is plotted as a function of the erosion value for area 16 or 18 at that processing point for that body 10. The correlation informations then include the resulting erosion-to-erosion data points on the graph.

Figure 4A:
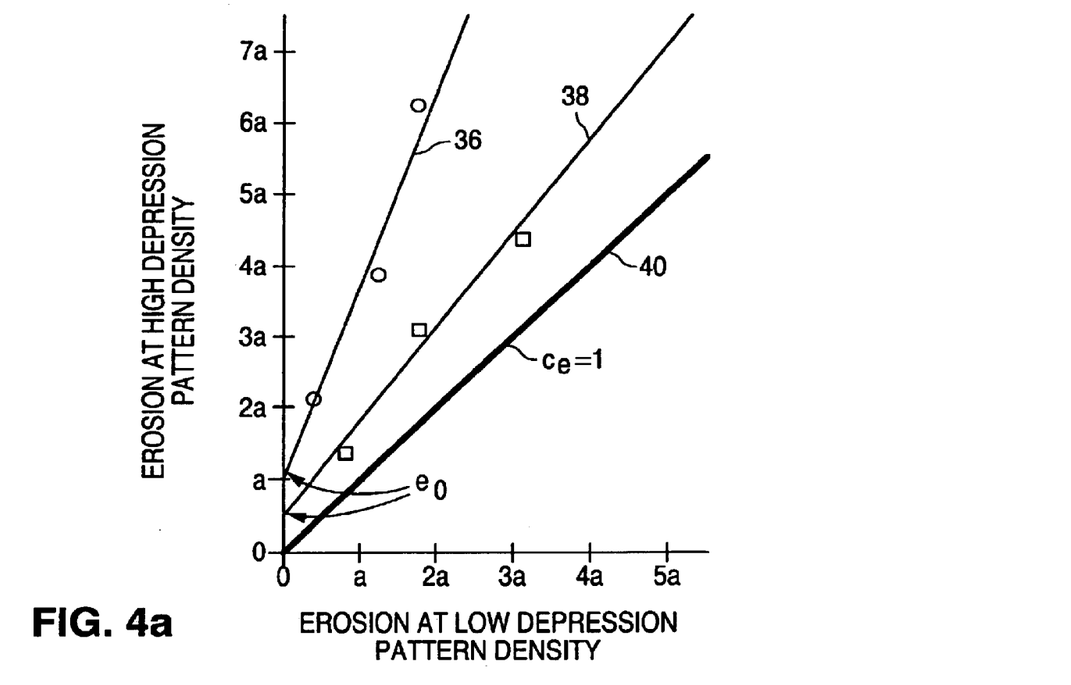
FIGS. 4a and 4b are graphs of erosion for areas at one of the depression pattern densities as a function of erosion for areas at the other depression pattern density for comparing the CMP process in the fabrication sequence represented by FIGS. 2a–2c and 2d.2–2f.2 to the CMP process in the fabrication sequence represented by FIGS. 2a–2c and 2d.2–2f.2 according to the invention.
Figure 4B:
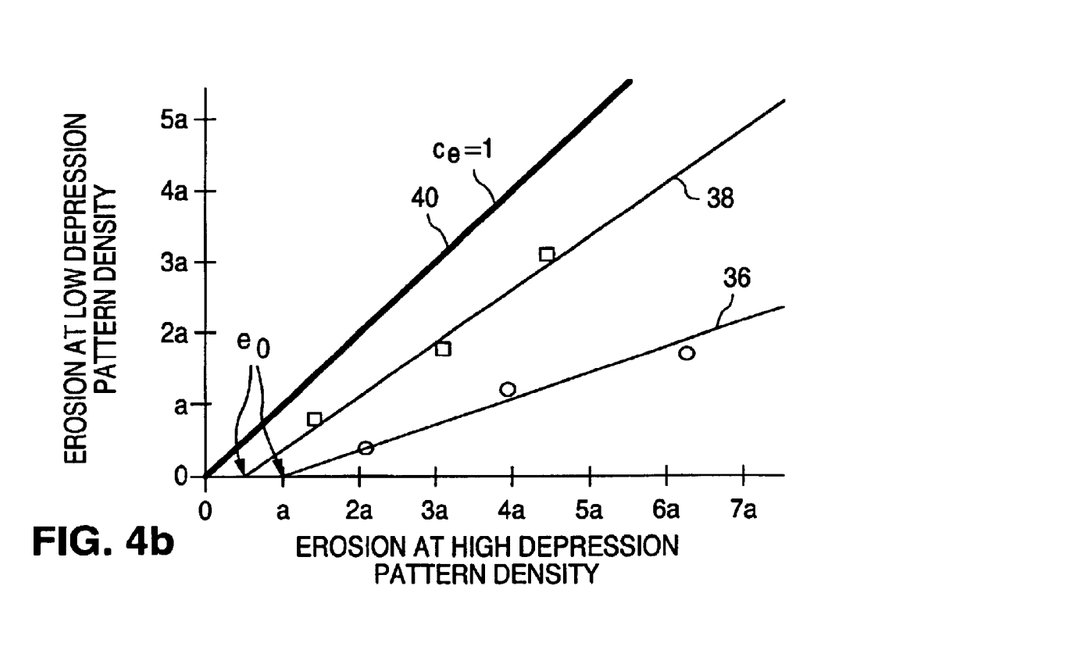

FIGS. 4a and 4b present two examples of such a linear-linear graph for correlating the measured erosion data. In FIG. 4a, the erosion values for each area 18 at the second, or high, depression pattern density are plotted as a function of the corresponding erosion values for associated area 16 at the first, or low, depression pattern density. The opposite occurs in FIG. 4b. The circles in FIG. 4a and 4b are the correlated erosion-to-erosion data points at three processing points, e.g., the stages of FIGS. 2d.1–2f.1, for the first CMP process. The squares in FIGS. 4a and 4b are the correlated erosion-to-erosion data points at three processing points, e.g., the stages of FIGS. 2d.2–2f.2, for the second CMP process. On the axes of FIGS. 4a and 4b, item "a" is a unit distance of erosion.

With the erosion-to-erosion data points so graphically arranged, the correlation procedure normally further includes approximating the erosion-to-erosion data points for each CMP process by a straight line on a linear-linear graphical scale. The correlation informations then include the resulting two straight lines which preferably closely approximate best-fit straight lines. Item 36 in FIGS. 4a and 4b is a straight line that approximates the erosion-to-erosion data points for the first CMP process. Item 38 is a straight line that approximates the erosion-to-erosion data points for the second CMP process. Because the difference in depression pattern density causes valley 34 in each body 10 to start forming before valley 32 in that body 10, erosion-to-erosion lines 36 and 38 intersect the high depression pattern density axis at positive values.

Ideally, erosion in a CMP process should be independent of depression pattern density. In other words, the erosion at area 18 in body 10 at each processing point during CMP overpolishing is ideally the same as the erosion at area 16 in that body 10 at that processing point. This ideal situation is represented by straight line 40 in FIGS. 40*a* and 40*b*. Line 40, which intersects the origin in each of FIGS. 4*a* and 4*b*, has a slope of 1 on a linear-linear graphical scale. Suitable correlation target criteria for an erosion-to-erosion line for a CMP process is thus a slope of 1 on a linear-linear graphical scale.

Lines 36 and 38 in FIG. 4*a* or 4*b* are compared to determine which, if either, has a slope closest to 1. In the exemplary situation represented by FIGS. 2*d*.1–2*f*.1, 2*d*.2–2*f*.2, and either FIG. 4*a* or 4*b*, line 38 for the second CMP process has a slope closest to 1. Consequently, the second CMP process is typically designated as the better of the two CMP processes in this example.

The erosion-to-erosion correlation informations for the two CMP processes can generally be compared without actually preparing a graph such as that of FIG. 4*a* or 4*b*. For the typical situation in which there are multiple pairs of erosion values at areas 16 and 18 for each CMP process, the multiple pairs of erosion values for each CMP process can be approximated by the linear relationship:

$$e_y = c_e e_x + e_0$$

where $e_x$ is approximately the erosion occurring in one of valleys 32 and 34 along the associated one of areas 16 and 18 of each body 10, $e_y$ is approximately the erosion occurring in the other of valleys 32 and 34 along the similarly associated other one of areas 16 and 18 of that body 10 when erosion $e_x$ approximately occurs in the first-mentioned one of valleys 32 and 34 along the associated first-mentioned one of areas 16 and 18 of that body 10, $c_e$ is an erosion coefficient, and $e_0$ is an erosion offset. Erosion coefficient $c_e$ is the slope of line 36 or 38 in FIGS. 4*a* and 4*b*. Erosion offset $e_0$ is the value of the erosion along the high depression pattern density axis in each of FIGS. 4*a* and 4*b*.

Erosion coefficient $c_e$ is determined for each CMP process. The $c_e$ values, which now constitute part of the correlation informations, are compared to determine which of the two $c_e$ values, if either, is closest to 1, the ideal value of coefficient $c_e$. If one of the $c_e$ values is indeed closest to 1, the CMP process having that $c_e$ value is typically designated as the better of the two CMP processes. In the example presented above in connection with FIGS. 2*d*.1–2*f*.1, 2*d*.2–2*f*.2, and either 4*a* or 4*b*, the $c_e$ value for the second CMP process is closest to 1. Hence, the second CMP process is again designated as the better CMP process.

FIGS. 5–8 illustrate four examples of each body 10 suitable for use in comparing CMP processes according to the invention. Each body 10 in FIGS. 5–8 is a wafer containing semiconductor material.

Figure 5:
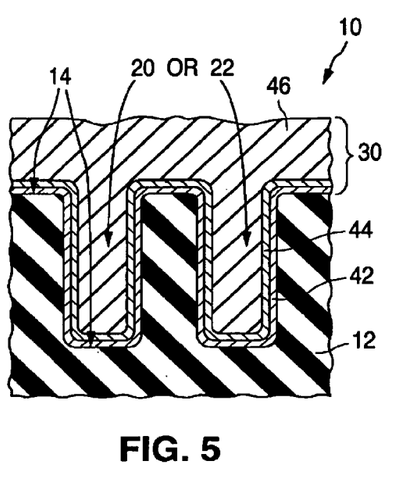
Figure 6:
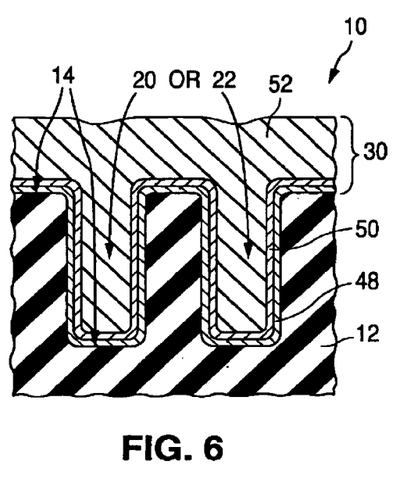

In FIGS. 5 and 6, CMP is performed on electrically conductive material, largely metal. Substructure 12 in FIGS. 5 and 6 includes dielectric material that largely defines internal surface 14. Although not shown in FIGS. 5 and 6, substructure 12 normally also includes a substrate consisting of monocrystalline semiconductor material, typically monocrystalline silicon, situated below the dielectric material and often separated from the dielectric material by one or more other layers.

Depression-occupying layer 30 in FIG. 5 consists of (a) a thin lower layer 42 of titanium situated on substructure 12 along internal surface 14, (b) a thin intermediate layer 44 of titanium nitride situated on titanium layer 42, and (c) a thick upper layer 46 of tungsten or aluminum situated on titanium nitride layer 44. Layer 30 in FIG. 6 consists of (a) a thin lower layer 48 of tantalum situated on substructure 12 along surface 14, (b) a thin intermediate layer 50 of tantalum nitride situated on tantalum layer 48, and (c) a thick upper layer 52 of copper situated on tantalum nitride layer 50. Trenches 20 and 22 in FIG. 5 or 6 are largely occupied by thick upper metal layer 46 or 52.

Figure 7:
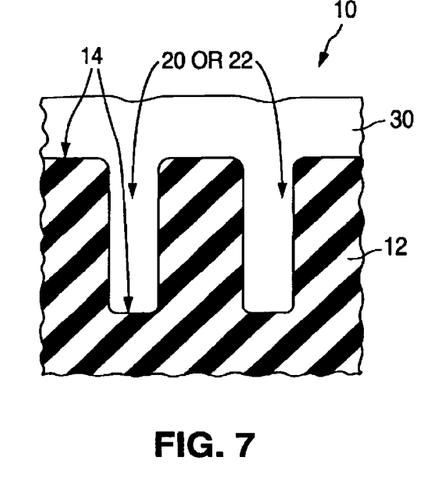

CMP is performed on non-monocrystalline semiconductor material in FIG. 7. Analogous to FIGS. 5 and 6, substructure 12 in FIG. 7 includes dielectric material that largely defines internal surface 14. Also analogous to FIGS. 5 and 6, substructure 12 normally further includes a substrate consisting of monocrystalline semiconductor material, typical monocrystalline silicon, situated below the dielectric material. Depression-occupying layer 30 in FIG. 7 consists of non-monocrystalline semiconductor material, typically polycrystalline silicon.

Figure 8:
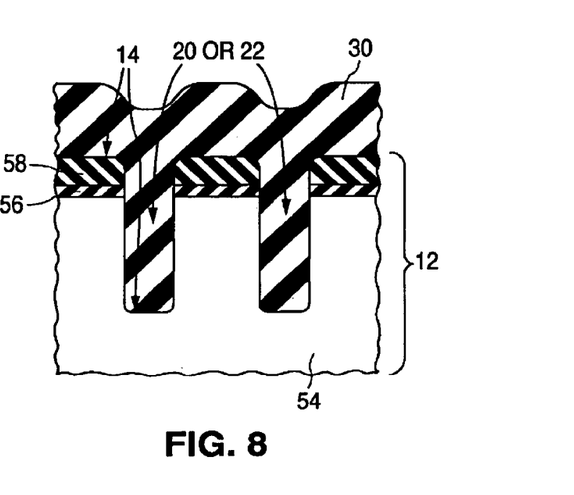
Figure 31:
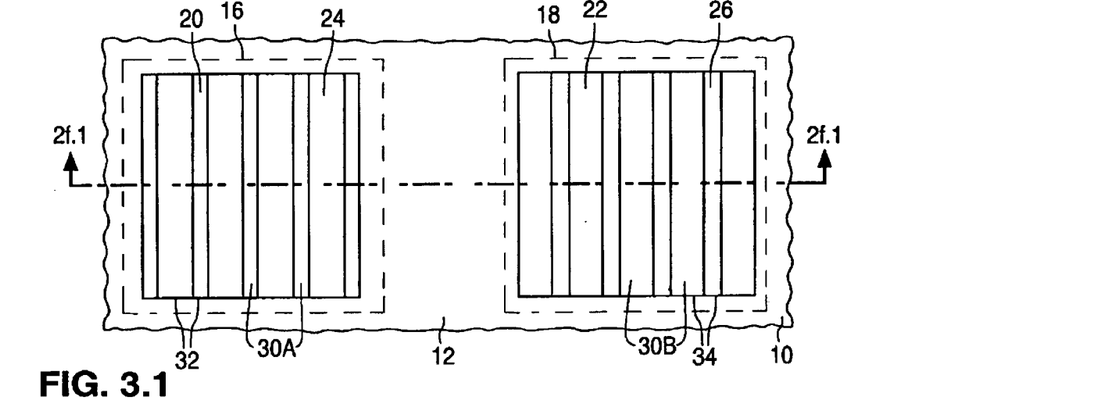
Figure 32:
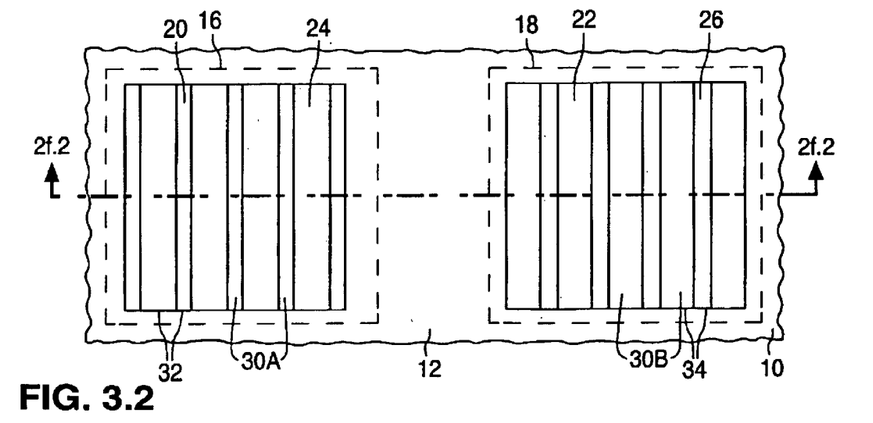

In FIG. 8, CMP is performed on dielectric material. Substructure 12 in FIG. 8 contains (a) a substrate 54 formed with monocrystalline semiconductor material, typically monocrystalline silicon, (b) an electrically insulating pad layer 56 of semiconductor oxide, typically silicon oxide, situated on substrate 54, and (c) a hard electrically insulating layer 58 of silicon nitride situated on pad layer 56. Trenches 20 and 22 in FIG. 8 extend through insulating layers 58 and 56 and into substrate 54. Depression-occupying layer 30 consists of dielectric material in FIG. 8 so that performing CMP on the structure of FIG. 8 leads to a shallow trench-isolated structure.

While the invention has been described with respect to particular embodiments, this description is solely for the purpose of illustration and is not to be construed as limiting the scope of the invention claimed below. For example, the erosion-to-erosion correlation information for the first CMP process can be generated on two or more of first bodies 10. The erosion-to-erosion correlation information for the second CMP process can likewise be generated on two or more second bodies 10.

The principles of the invention can be employed in comparing more than two CMP processes to one another using one or more bodies 10 in addition to first and second bodies 10. Correlated erosion-to-erosion information for each additional such CMP process is generated in the manner described above. The three or more CMP processes can then be compared to one another by (a) plotting the erosion-to-erosion information for each additional CMP process on a graph, such as that of FIG. 4*a* or 4*b*, having the erosion-to-erosion information for the first and second CMP processes, (b) approximating the erosion-to-erosion information for each additional CMP process by a straight line, and (c) comparing the slopes of the straight lines for all the CMP processes to see which, if any, of the slopes comes closest to 1 on a linear-linear graphical scale. Alternatively, the three or more CMP processes can be compared by (a) generating slope coefficient $c_e$ for each additional CMP process and (b) comparing the $c_e$ values for all the CMP processes to determine which, if any, of the $c_e$ values comes closest to 1. If the slope (on a linear-linear graphical scale) or $c_e$ value for only one of the CMP processes comes closest to 1, that CMP process can be designated as the better of the three or more CMP processes.

Two or more graphs, each of the type presented in FIG. 4*a* or 4*b*, can be employed in comparing two or more different CMP processes. The correlated erosion-to-erosion information, along with a straight-line approximation on a linear-linear graphical scale, for one of the CMP processes can be presented on one such graph. The correlated erosion-to-erosion information, along with a straight-line approximation on a linear-linear graphical scale, can be presented on another such graph for another of the CMP processes. The correlated erosion-to-erosion information, again including a straight-line approximation on a linear-linear graphical scale, for any further CMP process can be presented on one or both of the preceding two graphs or/and on a further such graph.

Depressions 20 and 22 can have shapes other than straight trenches. For example, depressions 20 and 22 can be shaped laterally like circles, ovals, and so on, including lateral shapes that combine straight lines and curved lines. In particular, depressions 20 and 22 can be configured generally as cylinders for receiving tungsten, aluminum, or polycrystalline silicon plugs.

There may only be one depression 20 in each lateral area 16 and/or only one depression 22 in each lateral area 18. In this limiting case, the single depression 20 in area 16, or single depression 22 in area 18, is shaped, e.g., laterally like an upper-case "E", "H", "M", "N", "S", "U", "V", or "W", in such a manner that one or more parts of associated substructure 12 are situated laterally between parts of that depression 20 or 22 for enabling that depression 20 or 22 to be at a below-unity depression pattern density. For the case in which there is only a single depression 20 or 22 in area 16 or 18, that depression can also be configured, e.g., like a rectangle, oval, or circle, so that the depression pattern density for that area 16 or 18 is unity (1) provided that the depression pattern density for the other area 18 or 16 is different and thus is below unity (less than 1).

While bodies 10 are normally all different, bodies 10 can sometimes be reused in evaluating CMP processes. Various modifications and applications may thus be made by those skilled in the art without departing from the true scope of the invention as defined in the appended claims.

I claim:

1. A method performed with at least one first body and at least one second body, each first body having an internal surface provided with (a1) a first pattern of at least one depression at a first depression pattern density in a first lateral area and (b1) a second pattern of at least one depression at a second depression pattern density in a second lateral area, the depression pattern densities being different, each second body having an internal surface provided with (a2) a first pattern of at least one depression largely at the first depression pattern density in a first lateral area and (b2) a second pattern of at least one depression largely at the second depression pattern density in a second lateral area, a depression-occupying layer of each body substantially covering its internal surface and extending into its one or more depressions, the method comprising:

determining first and second values of erosion that respectively occur along the first and second areas of each first body generally at its one or more depressions at each of at least one processing point as a result of chemically-mechanically polishing each first body along its depression-occupying layer according to a first chemical-mechanical polishing ("CMP") process;

generating correlation information for the first CMP process by correlating the second value of erosion at each processing point for each first body to the first value of erosion at that processing point for that first body;

determining first and second values of erosion that respectively occur along the first and second areas of each second body generally at its one or more depressions at each of at least one processing point as a result of chemically-mechanically polishing each second body along its depression-occupying layer according to a second CMP process different from the first CMP process;

generating correlation information for the second CMP process by correlating the second value of erosion at each processing point for each second body to the first value of erosion at that processing point for that second body; and comparing the correlation information for the second CMP process to the correlation information for the first CMP process.

2. A method as in claim 1 wherein the internal surface of each body has a generally flat portion that laterally surrounds each of that body's depression patterns, erosion being measured largely from this flat portion.

3. A method as in claim 1 wherein the comparing act includes determining which, if either, of the correlation informations meets, or comes closest to meeting, specified correlation target criteria.

4. A method as in claim 3 wherein the correlation information for only one of the CMP processes meets, or comes closest to meeting, the target criteria, the method further including designating that one CMP process as the better of the two CMP processes.

5. A method as in claim 1 wherein the generating acts comprise graphically plotting the second value of erosion at each processing point for each body as a function of the first value of erosion at that processing point for that body, whereby the correlation informations comprises the data points formed by plotting the second values of erosion as a function of the first values of erosion.

6. A method as in claim 5 wherein there are a plurality of such data points for each CMP process, the generating acts further including graphically approximating the data points for each CMP process by a straight line on a linear-linear graphical scale, whereby the correlation informations include the two straight lines.

7. A method as in claim 6 wherein the comparing act includes determining which, if either, of the two straight lines has a slope closest to 1.

8. A method as in claim 7 wherein the straight line for only one of the CMP processes comes closest to having a slope of 1, the method including designating that one CMP process as the better of two CMP processes.

9. A method as in claim 1 wherein the correlation informations comprise a plurality of pairs of first and second values of erosion for each CMP process, the generating acts comprising:

approximating the plurality of pairs of first and second values of erosion for each CMP process by a linear relationship:

$$e_y = c_e e_x + e_0$$

where $e_x$ is approximately the erosion occurring along the first area of each body, $e_y$ is approximately the erosion occurring along the second area of that body when erosion $e_x$ approximately occurs along the first area of that body, $c_e$ is a slope coefficient, and $e_0$ is an erosion offset; and determining the slope coefficient $c_e$ for each CMP process, whereby the correlation informations include the two slope coefficients $c_e$.

10. A method as in claim 9 wherein the comparing acts include determining which, if either, of the slope coefficients $c_e$ comes closest to 1.

11. A method as in claim 10 wherein the slope coefficient $c_e$ for only one of the CMP processes comes closest to 1, the method including designating that one CMP process as the better of the two CMP processes.

12. A method as in claim 1 where both depression pattern densities are below unity.

13. A method as in claim 1 wherein:

the first depression patterns are largely identical; and the second depression patterns are largely identical.

14. A method as in claim 13 wherein both depression pattern densities are below unity.

15. A method as in claim 1 wherein each of the first and second areas has multiple depressions at the depression pattern density for that area.

16. A method as in claim 15 wherein the depressions comprise trenches.

17. A method as in claim 15 wherein at least part of the depressions are shaped generally like cylinders.

18. A method as in claim 15 wherein each depression pattern has a lateral pitch, the pitch of each second depression pattern being largely equal to the pitch of each first depression pattern.

19. A method as in claim 15 wherein:

the first depression patterns are largely identical;

the second depression patterns are largely identical;

the depressions of each first pattern comprise trenches at a first pitch; and the depressions of each second pattern comprise trenches at a second pitch largely equal to the first pitch.

20. A method as in claim 1 wherein each body comprises a wafer.

21. A method as in claim 19 wherein each wafer contains monocrystalline semiconductor material.

22. A method as in claim 21 wherein each depression-occupying layer comprises one of metal, non-monocrystalline semiconductor material, and dielectric material.

23. A method as in claim 1 wherein each body is different from each other body.

24. A method as in claim 2 wherein:

the first depression patterns are largely identical; and the second depression patterns are largely identical.

25. A method as in claim 5 wherein the internal surface of each body has a generally flat portion that laterally surrounds each of that body's depression patterns, erosion being measured largely from this flat portion.

26. A method as in claim 25 wherein:

the first depression patterns are largely identical; and the second depression patterns are largely identical.

27. A method as in claim 9 wherein the internal surface of each body has a generally flat portion that laterally surrounds each of that body's depression patterns, erosion being measured largely from this flat portion.

28. A method as in claim 27 wherein:

the first depression patterns are largely identical; and the second depression patterns are largely identical.

* * * * *